United States Patent [19]

Davidson

[11] Patent Number: 5,568,005
[45] Date of Patent: Oct. 22, 1996

[54] ACOUSTIC-MAGNETIC POWER GENERATOR

[76] Inventor: Dan A. Davidson, 4901 Laguna Ave., Sierra Vista, Ariz. 85636

[21] Appl. No.: 377,203

[22] Filed: Jan. 24, 1995

[51] Int. Cl.$^6$ .................................................. H01L 41/08
[52] U.S. Cl. .......................... 310/328; 310/311; 310/334; 336/110
[58] Field of Search ..................................... 310/311, 316, 310/317, 319, 322, 323, 328, 334, 339; 336/110, 155

[56] References Cited

U.S. PATENT DOCUMENTS

| | | | |
|---|---|---|---|
| 2,101,272 | 12/1937 | Scott | 310/328 X |
| 2,636,135 | 4/1953 | Peek, Jr. | 310/328 |
| 2,834,943 | 5/1958 | Grisdale et al. | 310/328 X |
| 3,246,287 | 4/1966 | Benson | 310/328 X |
| 3,261,339 | 7/1966 | Quinn | 310/328 X |
| 3,274,406 | 9/1966 | Sommers, Jr. | 310/334 |
| 3,309,628 | 3/1967 | Olson | 310/334 X |
| 3,457,463 | 7/1969 | Balamuth | 310/339 X |
| 4,443,731 | 4/1984 | Butler et al. | 310/26 X |
| 4,522,071 | 6/1985 | Thompson | 73/597 |

*Primary Examiner*—Mark J. Budd

[57] ABSTRACT

The Acoustic Magnetic Field Power Generator uses an acoustic signal focused into a permanent magnet to stimulate the nuclear structure of the magnet to cause the magnetic field of the permanent magnet to move or oscillate. This effect can be used to tap power from the oscillating magnetic field by putting a coil of wire in the oscillating field. When an alternating current signal generator is connected simultaneously to an acoustic transducer and a stimulating coil; whereby, both the acoustic transducer and the stimulating coil are located within the magnetic field of the magnet, the acoustic signal enhances the stimulating effect to the permanent magnet transformer. The acoustic transducer can be any acoustic generation device such as a piezoelectric, magnetostictive, or other acoustic transducer. The combined effect of the acoustic signal and the stimulating coil increases the efficiency of permanent magnet induction transformers.

4 Claims, 2 Drawing Sheets

ACOUSTIC-MAGNETIC POWER GENERATOR

BACKGROUND OF THE INVENTION

The present invention relates to a solid state electrical generator having no moving parts in its structure. More particularly, the invention makes use of a new method of stimulating the nuclear material of a permanent magnet so that the electronic structure of the atom will vibrate and thus cause the magnetic field of the permanent magnet to oscillate. It is a well-known fact that an oscillating magnetic field will induce electrical current in a coil and was originally discovered by Michael Faraday in the last century. What is new in this invention is the discovery of the ability of an acoustic field to stimulate the nuclear structure of a material to cause the electrons to wobble under the influence of the acoustic field. If the material is magnetic or temporarily magnetized by an external magnetic field then the magnetic field will vibrate under the stimulus of the acoustic field. If this effect is combined with a coil which is simultaneously stimulating the magnet then the efficiency of stimulating the permanent magnet's field is enhanced. If a pickup coil is placed in the oscillating magnetic field so as to create an induction transformer then the combination of the acoustic and magnetic stimulation will enhance the efficiency of the induction transformer.

The most relevant prior art known to the inventor comprises U.S. Pat. No. 4,904,926 (1990) to Mario Pasichinsky, entitled Magnet Motion Electrical Generator; and U.S. Pat. No. 4,077,001 (1978) to Frank Richardson, entitled Electromagnetic Converter With Stationary Variable-Reluctance Members; and U.S. Pat. No. 4,006,401 (1977) to de Rivas, entitled Electromagnetic Generator.

The above references to Pasichinsky, Richardson, and de Rivas all use inductive methods to stimulate the motion of a permanent magnetic field. In the de Rivas invention, the Electromagnetic Generator, the flux of the permanent magnet is "alternate(d) by switching" using inductive coupling. In the Richardson disclosure an "energy conversion system" the flux of the permanent magnet is also "shifted" by inductive means. In the Pasichinsky disclosure, alternating magnetic coils induce flux changes in a closed magnetic circuit and output coils attached to the circuit are induced by the changing flux to produce a magnetic field. All of these devices are essentially variations of transformer design with permanent magnets as part of the transformer cores and all use magnetic induction. The transformer aspect of these references is the use of permanent magnets as the transformer core with coils wrapped around the magnetic core which are energized to produce oscillation or movement of the permanent magnet's field. The above references are herein called under a class name herein referred to as "permanent magnet transformers".

Other prior art relevant to the invention are U.S. Pat. No. 2,101,272 (1937) to H. J. Scott, entitled Combined Magnetostriction and Piezoelectric Selective Device; and U.S. Pat. No. 2,636,135 (1953) to R. L. Peek, Jr. entitled Stress Coupled Core and Crystal Transformer, and U.S. Pat. No. 2,834,943 (1958) to R. O. Grisdale, etal entitled Mechanically Coupled Electromechanical and Magnetomechanical Transducers, and U.S. Pat. No. 3,246,287 (1966) to H. F. Benson entitled Piezoelectric Transformer, and U.S. Pat. No. 3,261,339 (1966) to H. P. Quinn entitled Magnetostrictive Transformer, and U.S. Pat. No. 3,274,406 (1966) to H. S. Sommers, Jr. entitled Acoustic Electromagnetic Device, and U.S. Pat. No. 3,309,628 (1967) to F. A. Olson entitled YIG Variable Acoustic Delay Line, and U.S. Pat. No. 3,457,463 (1969) to L. Balamuth entitled Method and Apparatus for Generating Electric Currents of Small Magnitude, and U.S. Pat. No. 4,443,731 (1984) to Butler et al. entitled Hybrid Piezoelectric and Magnetostrictive Acoustic Wave Transducer, and U.S. Pat. No. 4,552,071 (1985) to R. B. Thompson entitled Method and Apparatus for Measuring Stress.

The above cited reference to Peek takes advantage of the difference in operation of piezoelectric and magnetostrictive crystals to produce a response in one when stimulated by the other. The Peek patent does not use an acoustic wave to stimulate a permanent magnet as in the present invention.

The above cited reference to Sommers is a transducer which uses a conductive bar or tube, which supports relatively slow helicon waves, placed next to a piezoelectric or magnetostrictive crystal. The transducer is designed in such a way to either enhance the acoustic wave or the electric wave by interaction of the two materials. The Sommers patent does not use an acoustic wave to stimulate a permanent magnet as in the present invention to enhance to oscillation of the magnetic field.

The above cited reference to Balmuth uses mechanically resonant reeds, rods, or chambers that are coupled to transducers that are piezoelectric, magnetostrictive, or transistorized. The electrical output of the transducers stimulate an electrical circuit when the resonator receives acoustic energy and again does not use an acoustic wave to stimulate a permanent magnet as in the present invention to enhance to oscillation of the magnetic field.

The above cited reference to Olson uses an acoustically responsive material such as a piezoelectric or a magnetostrictive to act as a delay line for microwave signals and again does not use an acoustic wave to stimulate a permanent magnet as in the present invention to enhance to oscillation of the magnetic field.

The above cited references to Benson, Quinn, Grisdale, Scott, and Butler are all concerned with acoustic transducers which convert acoustic pressure to an electrical signal or vice versa using only the piezoelectric and/or the magnetostrictive effect. The Benson patent is an underwater acoustic transformer which converts acoustic waves hitting a transducer into an electromagnetic field which excites a transformer. The Quinn patent uses a magnetostrictive effect to stimulate piezoelectric crystals to output a high voltage which is a reverse of the Benson patent. The Grisdale patent uses mechanically stacked piezoelectric or magnetostrictive crystals to produce a more efficient mechanical gyrator. The Scott patent uses and electrical oscillator to stimulate magnetostrictive rods which put pressure on piezoelectric crystals to output a high voltage from the piezoelectric crystals. The Butler patent uses a combined effect of piezoelectric and magnetostrictive crystals to produce an enhanced acoustic energy detector.

The above cited reference to Thompson uses a permanent magnetic transducer to induce eddy currents in metal which is in the field of the transducer or uses moving eddy currents in a piece of metal to stimulate a magnetic field. The induction of the eddy currents is the result of an oscillating magnetic field generated in the transducer.

None of the above cited references use an acoustic wave to stimulate the atoms of a permanent magnet and hence are not related to this invention.

SUMMARY OF THE INVENTION

An object of this invention is to provide a power generator invention with no moving parts therein.

Another object of this invention is to use an acoustic field to stimulate the nuclear level of the magnetic material and provide a method of oscillating the magnetic field of permanent magnets.

Another object of this invention is to provide a simple method of generating electrical energy by including a piezoelectric transducer which is used to vibrate the magnetic field of a permanent magnet. When the nucleus the atom is vibrated by the piezoelectric, it in turn, vibrates the electronic structure of all the atoms. Since the electronic structure is the basis of the magnetic field of the magnet then the entire magnetic field of the magnet is vibrated when the electronic structure is vibrated. Coils placed in the vibrating magnetic field will have voltage and current induced in them.

It is well established fact that when the magnetic field of the permanent magnet is vibrated it is possible to generate an alternating current in a coil winding which is within the vibrating magnetic field influence. What is unique about this invention is to increase the efficiency of permanent magnet transformers by using acoustic stimulation from piezoelectrics to further stimulate the permanent magnet so as to add to the inductive effects of permanent magnet transformers. This invention does this by stimulating the permanent magnet cores of permanent magnet transformers with an acoustic field generated by a piezoelectric or other acoustically active generator which is vibrated at the same frequency as the electrical induction of the permanent magnet transformers.

DETAILED DESCRIPTION OF THE INVENTION

Figure 1:
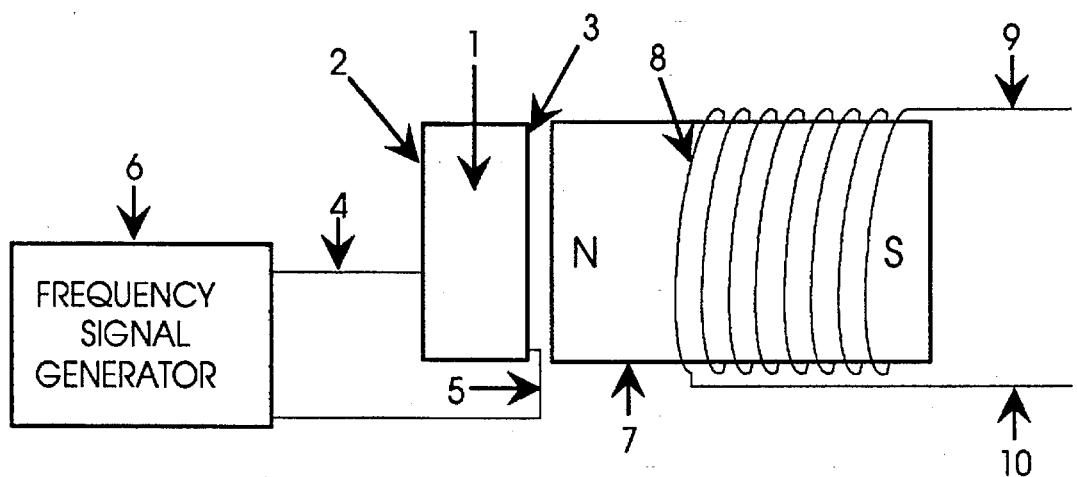
FIG. 1 illustrates a frequency signal generator attached to and driving a piezoelectric which is in the acoustic proximity of a bar type of permanent magnet with a output coil placed within the magnetic field of the permanent magnet.

In FIG. 1 a frequency signal generator 6 is connected to a piezoelectric 1 via wires 4 and 5 connected to the electrode surfaces of the piezoelectric 2 and 3 respectively. The piezoelectric 1 is defined to be a high dielectric material such as barium titanate or lead zirconate titanate or any other acoustic transducer material suitable for sonic and ultrasonic generators. The piezoelectric 1 is placed in close proximity to the permanent magnet 7 such that the acoustic field of the piezoelectric 1 can radiate into the permanent magnet material. A permanent magnet transformer defined by a coil 8 is in the magnetic field of the permanent magnet 7. When the piezoelectric 1 is stimulated by the frequency generator 6 then a voltage and current is generated at the output 9 and 10 of the above defined permanent magnet transformer.

Figure 2:
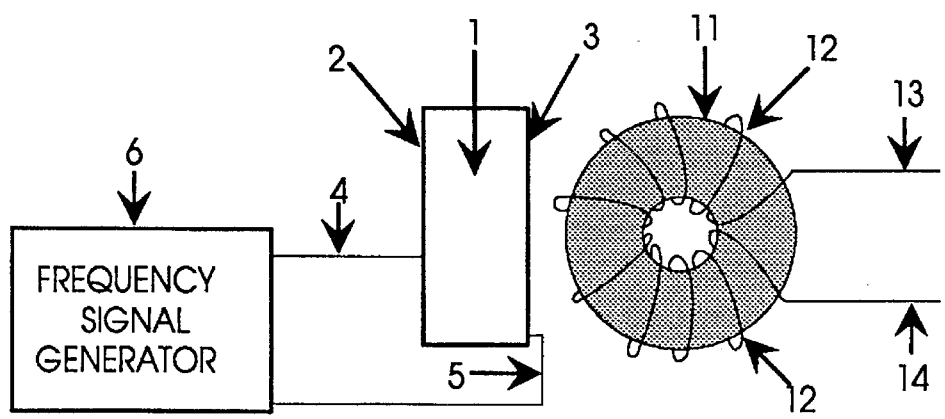
FIG. 2 illustrates a frequency signal generator attached to and driving a piezoelectric which is in the acoustic proximity of a toroidal type of permanent magnet with an output coil wrapped around the toroidal permanent magnet.

Another embodiment of this invention is shown in FIG. 2. and is similar to FIG. 1. with a similar frequency signal generator 6 connected to a piezoelectric material 1 via wires 4 and 5 connected to the electrode surfaces of the piezoelectric 2 and 3 respectively. The piezoelectric 1 is as defined above, that is, a material suitable for sonic and ultrasonic generators. The piezoelectric 1 is placed in close proximity to the permanent magnet 11 such that the acoustic field of the piezoelectric 1 can radiate into the permanent magnet material. A permanent magnet transformer defined by a coil 12 in the magnetic field of the permanent magnet 11. When the piezoelectric 1 is stimulated by the frequency generator 6 then a voltage and current is generated at the output 13 and 14 of the above defined magnetic transformer.

Figure 3:
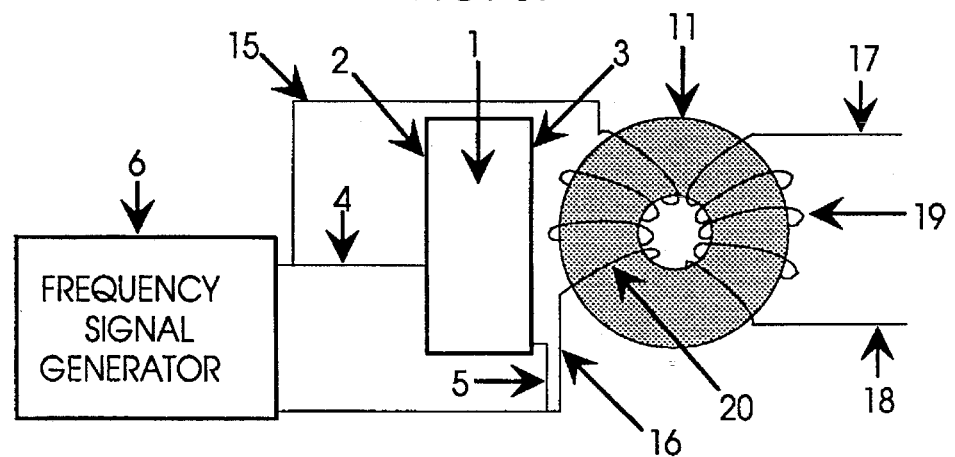
FIG. 3 illustrates a frequency signal generator attached to and driving a piezoelectric which is in the acoustic proximity of a toroidal type of permanent magnet transformer and the signal generator is also driving the input coil of the torroidal permanent magnet transformer.

FIG. 3 is similar to FIG. 1 and FIG. 2 with a frequency signal generator 6 connected to a piezoelectric 1 via wires 4 and 5 connected to the electrode surfaces of the piezoelectric 2 and 3 respectively. The piezoelectric 1 is as defined in the descriptions above. The signal generator 6 is also connected to the input coil 20 of the permanent magnet transformer defined by the torroidal permanent magnet core 11, input coil 20 and output coil 19. The piezoelectric 1 is placed in close proximity to the permanent magnet 11 such that the acoustic field of the piezoelectric 1 can radiate into the permanent magnet material. The magnetic transformer defined by 11, 19, and 20 is in the magnetic field of the permanent magnet 11 and is connected to the frequency signal generator 6 wires 15 and 16. The frequency generator 6 by stimulates the piezoelectric 1 which stimulates the permanent magnet transformer via the acoustic field and at the same time the signal generator also stimulates the coil electromagnetically. A voltage and current is generated at the output coil 19 and power can be taken from the output wires 17 and 18 of the magnetic transformer.

Figure 4:
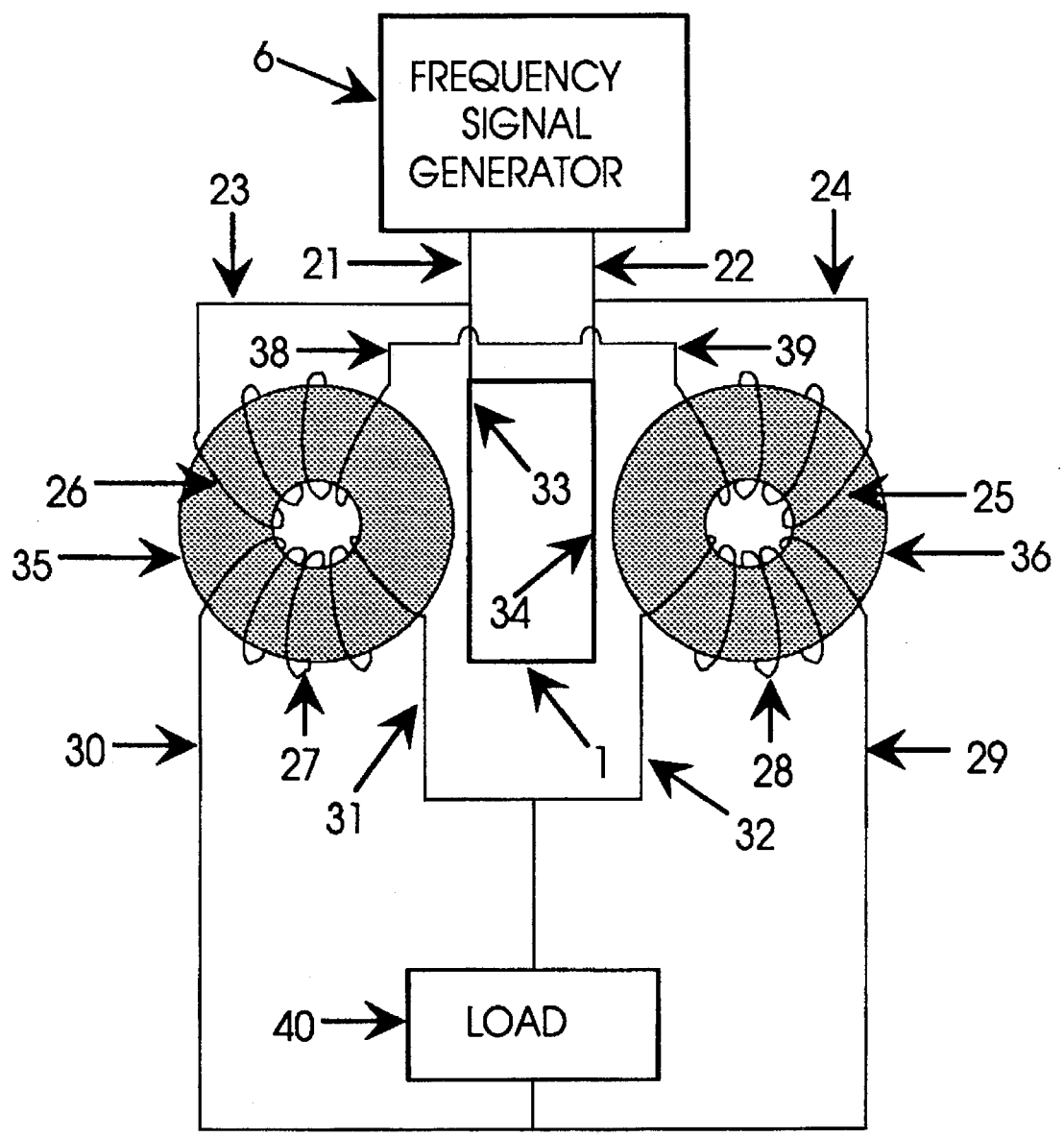
FIG. 4 illustrates a frequency signal generator attached to and driving two torroidal core permanent magnet transformers as well as an acoustic transducer that is in acoustic proximity of the torroidal cores.

A further embodiment of this invention, shown in FIG. 4, is a frequency signal generator 6 driving a pair of permanent magnet transformers defined by 26, 35, 27 and 25, 36, 28 respectively and also driving a piezoelectric transducer 1. The piezoelectric is as described above. The signal generator is connected via input wires 23 and 24 to the input coil 26 of the permanent magnet transformer on the left and to the input coil 25 of the transformer on the right respectively. The other input wire 38 of the left permanent magnet transformer is connected to the remaining input wire 39 of the right magnetic transformer. The output of the signal generator in also connected to the piezoelectric 1 via connections 21 and 22 to the connector surface of the piezoelectric 33 and 34 respectively. The output of the permanent magnet transformer on the left is connected to a load 40 via wire 30 and the output of the permanent magnet transformer on the right is connected to the load via wire 29. The remaining output wires 31 and 32 of the left and right permanent magnet transformers are also connected to the load. The load 40 can be anything such as a motor or electrical lights or appliance.

This invention is not limited to the 4 different versions of the invention shown in FIGS. 1, 2, 3, and 4 as there are any number of cascading and electrical hookup techniques that can be accomplished to amplify power and to take advantage of the acoustic influence of the piezoelectric upon the magnetic material. Similarly, this invention is not limited to the torroidal core configuration as there can be many types of permanent magnet transformers with any number of magnetic core and coil configurations that can be enhanced with acoustic stimulation depending on power and output requirements according to the rules of electronics and those familiar with the state of the art in permanent magnet power transformers.

What is claimed is:

1. An acoustic magnetic power generator composed of an alternating current signal generator connected to an acoustic transducer which stimulates the core of a permanent magnet such that the atoms of the magnet are caused to vibrate which in turn causes the magnetic field to vibrate and causes a current and voltage to be generated in an output coil wrapped around a permanent magnet or in the magnetic field of the permanent magnet which said current and voltage can be used for powering a load.

2. An acoustic magnetic power generator composed of an alternating signal generator connected to an acoustic transducer which stimulates the core of a permanent magnet and causes the core to vibrate; the signal generator further connected to a drive coil surrounding the permanent magnet, and an output coil within the field of the permanent magnet which by induction generates an electrical output.

3. A method of causing the magnetic field of permanent magnet transformers to oscillate by the application of an acoustic signal applied to the atomic structure of permanent magnet.

4. A method of maximizing the efficiency of permanent magnet transformers by stimulating the core material of the permanent magnet transformers with both an acoustic vibration and an electromagnetic signal simultaneously.

* * * * *